United States Patent
Suich et al.

(10) Patent No.: US 11,024,613 B2
(45) Date of Patent: Jun. 1, 2021

(54) LUMIPHORIC MATERIAL REGION ARRANGEMENTS FOR LIGHT EMITTING DIODE PACKAGES

(71) Applicant: Cree, Inc., Durham, NC (US)

(72) Inventors: David Suich, Durham, NC (US);
Arthur F. Pun, Raleigh, NC (US);
Colin Blakely, Raleigh, NC (US)

(73) Assignee: CreeLED, Inc., Newark, CA (US)

( * ) Notice: Subject to any disclaimer, the term of this patent is extended or adjusted under 35 U.S.C. 154(b) by 0 days.

(21) Appl. No.: 16/675,750

(22) Filed: Nov. 6, 2019

(65) Prior Publication Data

US 2021/0134766 A1    May 6, 2021

(51) Int. Cl.
*H01L 25/075* (2006.01)
*H01L 33/62* (2010.01)
*H01L 33/26* (2010.01)

(52) U.S. Cl.
CPC .......... *H01L 25/0753* (2013.01); *H01L 33/26* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 8,759,847 B2 | 6/2014 | Xu et al. | |
| 9,419,189 B1 * | 8/2016 | David | H01L 33/32 |
| 10,074,635 B2 | 9/2018 | Tiwari et al. | |
| 2013/0328073 A1 * | 12/2013 | Lowes | H01L 33/54 |
| | | | 257/89 |
| 2014/0175492 A1 * | 6/2014 | Steranka | H01L 33/44 |
| | | | 257/98 |
| 2015/0076534 A1 | 3/2015 | Terakami et al. | |
| 2016/0351761 A1 * | 12/2016 | David | H01L 33/46 |
| 2017/0069606 A1 * | 3/2017 | Gould | H01L 33/507 |

(Continued)

OTHER PUBLICATIONS

Everlight Automotive, "EL Micro Multi CH1216-C8W80801H-AM," Datasheet, 2014, 26 pages.
(Continued)

*Primary Examiner* — J. E. Schoenholtz
(74) *Attorney, Agent, or Firm* — Withrow & Terranova, P.L.L.C.

(57) ABSTRACT

Lumiphoric material region arrangements are provided for light-emitting diode (LED) packages. Certain aspects relate to arrangements of light-altering materials and lumiphoric material regions for LED packages. Lumiphoric material regions over corresponding LED chips may include increased sizes relative to overall LED package dimensions. Lumiphoric material regions may be arranged to extend to certain peripheral edges of an LED package. Multiple lumiphoric material regions and corresponding LED chips may be arranged in close proximity to one another to provide LED packages with multiple and selectable illumination characteristics. Light-altering materials may be arranged that at least partially define certain peripheral edges of lumiphoric material regions. The light-altering materials may form one or more nonintersecting segments arranged about the lumiphoric material regions. Certain aspects relate to LED packages having one or more of reduced sizes, increased light output, and reduced fabrication steps.

32 Claims, 12 Drawing Sheets

(56) References Cited

U.S. PATENT DOCUMENTS

2017/0162547 A1* 6/2017 Bergmann .............. H01L 33/62
2019/0057954 A1   2/2019 Blakely et al.
2019/0058003 A1   2/2019 Blakely et al.

OTHER PUBLICATIONS

Samsung, "High Power LED Ceramic Series (C-Series) 3020 Bi color: AH302A_WA SPHWATABN100," Product Family Data Sheet, Rev. 1.0, Jan. 30, 2018, 24 pages.
Seoul Semiconductor, "SWWACD07S—WICOP-C," Preliminary Product Brief, Rev0.1, Mar. 28, 2018, 25 pages.
Seoul Semiconductor, "SWWACD11S—WICOP-C 1x2 White Amber (3P)," Product Brief, Rev1.0, May 24, 2017, 25 pages.

* cited by examiner

LUMIPHORIC MATERIAL REGION ARRANGEMENTS FOR LIGHT EMITTING DIODE PACKAGES

FIELD OF THE DISCLOSURE

The present disclosure relates to solid-state lighting devices including light-emitting diodes (LEDs), and more particularly to packaged LED devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

LED packages have been developed that include a single LED chip or multiple LED chips arranged within the same package. In some multiple LED chip packages, the LED chips can be provided such that emissions corresponding to individual LED chips are combined to produce a desired light emission for the LED package. The emissions corresponding to individual LED chips can be configured to provide similar or different colors that are combined to provide an overall light output for the LED package. In other multiple LED chip packages, emissions corresponding to different LED chips can be configured to provide different emission characteristics for such packages. There can be challenges in producing high quality light with desired emission characteristics when different emission colors are provided within a common LED package, particularly for smaller size LED packages.

The art continues to seek improved LEDs and solid-state lighting devices having desirable illumination characteristics capable of overcoming challenges associated with conventional lighting devices.

SUMMARY

Aspects disclosed herein relate to lumiphoric material region arrangements for light-emitting diode (LED) packages. Certain aspects disclosed herein relate to arrangements of light-altering materials and lumiphoric material regions for LED packages. Lumiphoric material regions over corresponding LED chips may be provided with increased sizes relative to overall LED package dimensions. In certain aspects, one or more lumiphoric material regions are arranged to extend to one or more peripheral edges of an LED package. Multiple lumiphoric material regions and corresponding LED chips may be arranged in close proximity to one another within a common LED package to provide multiple and selectable illumination characteristics. Light-altering materials may be arranged that at least partially define one or more peripheral edges of the lumiphoric material regions. Such light-altering materials may form one or more nonintersecting segments arranged about the lumiphoric material regions. Aspects disclosed herein provide LED packages that may have one or more of reduced sizes, increased light output, and reduced fabrication steps and associated costs.

In one aspect, an LED package comprises: a submount; at least one first LED chip on the submount and a first lumiphoric material region that is registered with the at least one first LED chip; and at least one second LED chip on the submount and a second lumiphoric material region that is registered with the at least one second LED chip, wherein at least one peripheral edge of the first lumiphoric material region and the second lumiphoric material region is vertically aligned within twenty-five microns (μm) or less of at least one peripheral edge of the submount. In certain embodiments, the at least one peripheral edge of the first lumiphoric material region and the second lumiphoric material region is vertically aligned and coplanar with the least one peripheral edge of the submount.

In certain embodiments, the LED package may further comprise a first light-altering material segment on the submount that forms an interior wall that is arranged between the first lumiphoric material region and the second lumiphoric material region. In certain embodiments, a peripheral edge of the first light-altering material segment is vertically aligned within five μm or less with a same peripheral edge of the submount that is vertically aligned with at least one peripheral edge of the first lumiphoric material region and the second lumiphoric material region. In certain embodiments, the peripheral edge of the first light-altering material segment is vertically aligned and coplanar with the same peripheral edge of the submount. In certain embodiments, the LED package further comprises a second light-altering material segment on the submount that forms at least one perimeter wall for at least one of the first lumiphoric material region and the second lumiphoric material region. In certain embodiments, the first light-altering material segment and the second light-altering material segment are nonintersecting with one another. In certain embodiments, at least one of the first light-altering material segment and the second light-altering material segment is arranged in a linear manner across the submount. In certain embodiments, at least one of the first light-altering material segment and the second light-altering material segment is arranged in a nonlinear manner across the submount.

In certain embodiments, the LED package may further comprise a divider on the submount that is arranged between the first lumiphoric material region and the second lumiphoric material region. The divider may comprise a height from the submount that is less than a height of at least one of the first lumiphoric material region and the second lumiphoric material region. In certain embodiments, the divider is a continuous portion of the submount.

In certain embodiments, the submount forms a recess that is arranged between the first lumiphoric material region and the second lumiphoric material region.

In certain embodiments, the LED package further comprises at least one third LED chip and a third lumiphoric material region that is registered with the at least one third LED chip.

In certain embodiments, the at least one first LED chip comprises a plurality of first LED chips.

In certain embodiments, the at least one peripheral edge of the first lumiphoric material region and the second lumiphoric material region is vertically aligned within five µm or less of the at least one peripheral edge of the submount.

In another aspect, an LED package comprises: a submount; at least one first LED chip on the submount and a first lumiphoric material region that is registered with the at least one first LED chip; at least one second LED chip on the submount and a second lumiphoric material region that is registered with the at least one second LED chip; and a light-altering material on the submount that is arranged to form one or more nonintersecting light-altering material segments that at least partially define one or more peripheral boundaries of the first lumiphoric material region and the second lumiphoric material region. In certain embodiments, at least one of the first lumiphoric material region and the second lumiphoric material region is vertically aligned within five µm or less of at least one peripheral edge of the submount. In certain embodiments, the one or more nonintersecting light-altering material segments form an interior wall between the first lumiphoric material region and the second lumiphoric material region. In certain embodiments, the at least one first LED chip and at least one the second LED chip are separately controllable relative to one another.

In certain embodiments, the LED package may further comprise a plurality of metal traces that provide separate anode and cathode connections for each of the at least one first LED chip and the at least one second LED chip, wherein the plurality of metal traces are arranged on a same face of the submount on which the at least one first LED chip and the at least one second LED chip are mounted. In certain embodiments, the LED package may further comprise a plurality of package contacts arranged on a back face of the submount that is opposite the face of the submount on which the at least one first LED chip and the at least one second LED chip are mounted. In certain embodiments, the LED package may further comprise a plurality of conductive vias that extend through the submount to form electrically conductive paths between the plurality of metal traces and the plurality of package contacts. In certain embodiments, the one or more nonintersecting light-altering material segments are arranged to cover only portions of the plurality of metal traces.

In certain embodiments, at least one of the first lumiphoric material region and the second lumiphoric material region forms a curved top surface. In certain embodiments, at least one of the first lumiphoric material region and the second lumiphoric material region comprises lumiphoric materials that are provided with a non-uniform distribution within a binder.

In certain embodiments, one or more of the at least one first LED chip and the at least one second LED chip is flip-chip mounted to the submount. In certain embodiments, at least one of the first lumiphoric material region and the second lumiphoric material region comprises at least one of dispensed lumiphoric materials, spray-coated lumiphoric materials, a pre-formed flexible sheet of lumiphoric materials, or a pre-formed rigid structure In another aspect, an LED package comprises: a submount; at least one LED chip on the submount and a lumiphoric material region that is registered with the at least one LED chip, wherein at least one peripheral edge of the lumiphoric material region is vertically aligned within five µm or less of at least one peripheral edge of the submount; and a light-altering material on the submount that is arranged to form one or more nonintersecting light-altering material segments that at least partially define one or more peripheral boundaries of the lumiphoric material region. In certain embodiments, the one or more nonintersecting light-altering material segments form at least one perimeter wall for the lumiphoric material region. In certain embodiments, a peripheral edge of the one or more nonintersecting light-altering material segments is vertically aligned within five µm or less of a same peripheral edge of the submount that is vertically aligned with at least one peripheral edge of the lumiphoric material region. In certain embodiments, the at least one LED chip comprises a plurality of LED chips. In certain embodiments, the at least one peripheral edge of the lumiphoric material region is vertically aligned within five µm or less of the at least one peripheral edge of the submount.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
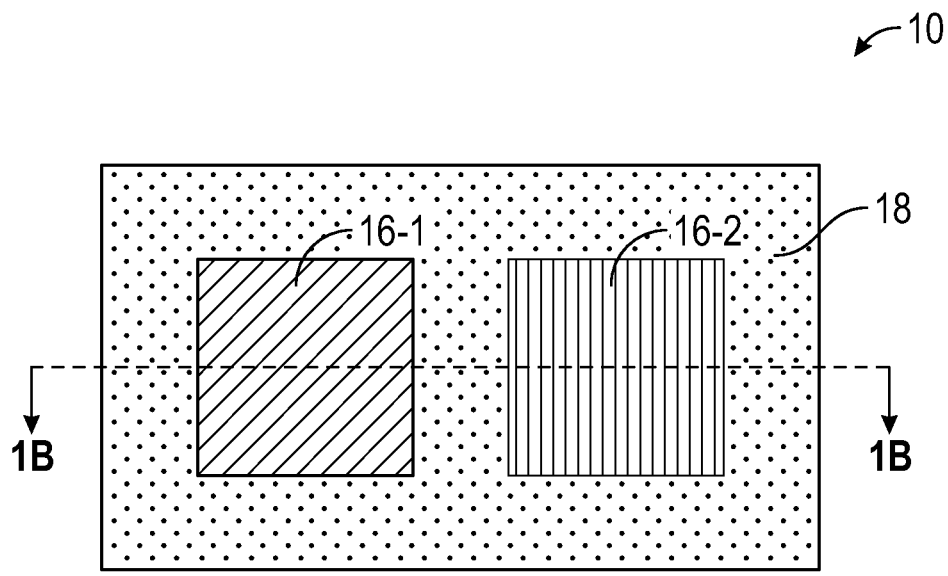
FIG. 1A is a top view of a typical light-emitting diode (LED) package that is capable of providing different emission characteristics.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein relate to lumiphoric material region arrangements for light-emitting diode (LED) packages. Certain aspects disclosed herein relate to arrangements of light-altering materials and lumiphoric material regions for LED packages. Lumiphoric material regions over corresponding LED chips may be provided with increased sizes relative to overall LED package dimensions. In certain aspects, one or more lumiphoric material regions are arranged to extend to one or more peripheral edges of an LED package. Multiple lumiphoric material regions and corresponding LED chips may be arranged in close proximity to one another within a common LED package to provide multiple and selectable illumination characteristics. Light-altering materials may be arranged that at least partially define one or more peripheral edges of the lumiphoric material regions. Such light-altering materials may form one or more nonintersecting segments arranged about the lumiphoric material regions. Aspects disclosed herein provide LED packages that may have one or more of reduced sizes, increased light output, and reduced fabrication steps and associated costs.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition (MOCVD). The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, undoped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red or red-orange light with a peak wavelength range of 600 nm to 650 nm. In certain embodiments, red light may include a peak wavelength range of 600 nm to 700 nm, or 650 nm to 700 nm depending on the application. The LED chip can also be covered with one or more lumiphoric materials or other conversion materials, such as phosphors, such that at least some of the light from the LED chip is absorbed by the one or more phosphors and is converted to one or more different wavelength spectra according to the characteristic emission from the one or more phosphors. In certain embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_x Eu_y AlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer may be arranged between the metal reflector layer and first and second electrical contacts, wherein the first electrical contact is arranged in conductive electrical communication with a first semiconductor layer, and the second electrical contact is arranged in conductive electrical communication with a second semiconductor layer. In certain embodiments, the first and second electrical contacts themselves may be configured as mirror layers. For single or multi-layer mirrors including surfaces exhibiting less than 100% reflectivity, some light may be absorbed by the mirror. Additionally, light that is redirected through the active LED structure may be absorbed by other layers or elements within the LED chip. External reflective surfaces may include one or more reflective surfaces of LED packages, lighting fixtures, and lighting housings.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In certain embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in certain embodiments high, reflectivity, and/or a desired, and in certain embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side or face of the LED chip that is opposite a substrate, such as a growth substrate. In an LED package, a lateral geometry LED chip may be mounted on a submount of the LED package such that the anode and cathode are on a face of the active LED structure that is opposite the submount. In this arrangement, wirebonds may be used to provide electrical connections with the anode and cathode. Certain embodiments disclosed herein relate to the use of flip chip LED devices in which a light transmissive substrate represents an exposed light-emitting surface. In such arrangements, the anodes and cathodes of LED chips that are flip-chip mounted may be mounted or bonded to electrical traces or patterns on the submount of the corresponding LED package. LED packages as disclosed herein may include arrangements that include one or more of submounts, electrical connections, light-altering materials, reflective materials, encapsulants, lenses, optics, and lumiphoric materials on or supporting one or more LED chips.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Embodiments as disclosed herein may be useful for LED packages that are capable of providing a number of changeable, selectable, or tunable emission characteristics that are generated from a common LED package. Such LED packages may be configured to provide a number of different light emission zones or surfaces that are separately controllable or selectable. In this regard, the different light emission zones or surfaces may be operated separately from one another in a manner that is similar to separately packaged LEDs in close proximity to one another. In certain applications, size and spacing limitations can make it impractical to use separately packaged LEDs. For example, in certain automotive applications, it may be desirable to configure exterior lighting devices under a common lens or optic that are capable of changing between different correlated color temperatures (CCTs) that correspond with day time and night time running conditions. For general lighting applications, individual LED packages as disclosed herein may be configured to change between different emission colors or CCT values, such as one or more of warm white (e.g., 2700 Kelvin (K)-3000 K), neutral white (e.g., 3500 K-4500 K), and cool white (5000 K-6500 K). For horticulture lighting applications, individual LED packages as disclosed herein may be configured to change between different emission characteristics that target various growth conditions of different crops.

LED packages are described herein that may include various arrangements of LED chips on submounts. The submount can be formed of many different materials with an exemplary material being electrically insulating. Suitable materials include, but are not limited to ceramic materials such as aluminum oxide or alumina, AlN, or organic insulators like polyimide (PI) and polyphthalamide (PPA). In other embodiments, the submount can comprise a printed circuit board (PCB), sapphire, Si or any other suitable material. For PCB embodiments, different PCB types can be used such as a standard FR-4 PCB, a metal core PCB, or any other type of PCB.

In certain embodiments, light-altering materials are provided that may be arranged to divide different lumiphoric materials and LED chips on a common submount. The light-altering material may be adapted for dispensing, or placing, and may include many different materials including light-reflective materials that reflect or redirect light, light-absorbing materials that absorb light, and materials that act as a thixotropic agent. As used herein, the term "light-reflective" refers to materials or particles that reflect, refract, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles.

In certain embodiments, the light-altering material includes both light-reflective material and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material. The light-reflective material may comprise a weight percent that is in a range of about 10% to about 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

In certain embodiments, the light-altering material may comprise a generally white color to reflect and redirect light. In other embodiments, the light-altering material may comprise a generally opaque or black color for absorbing light and increasing contrast of an LED package. The light-altering material can be dispensed or deposited in place using an automated dispensing machine where any suitable size and/or shape can be formed. The light-altering material may have a viscosity configured to be dispensed around a perimeter of an LED chip and surface tension will keep the light-altering material off of a primary emitting surface of the LED chip. Additionally, the light-altering material may wick in between adjacent LED chips that are separated by narrow lateral distances.

Figure 1B:
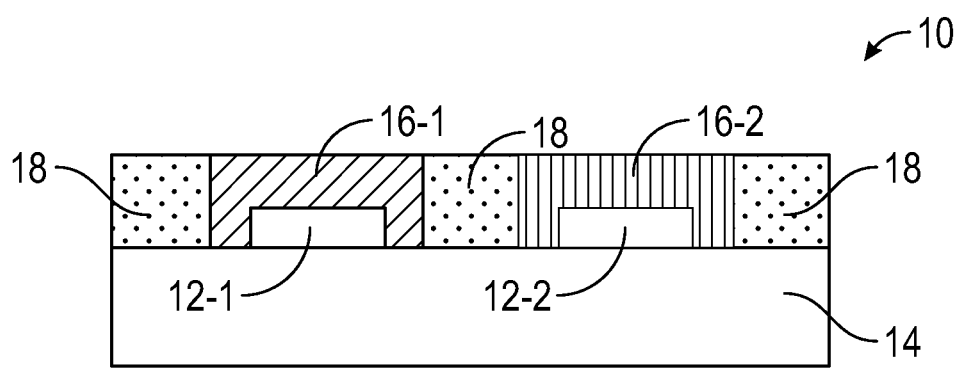
FIG. 1B is a side cross-sectional view of the LED package of FIG. 1A taken along the section line 1B-1B.

FIG. 1A is a top view of a typical LED package 10 that is capable of providing different emission characteristics, and FIG. 1B is a side cross-sectional view of the LED package 10 of FIG. 1A taken along the section line 1B-1B. As illustrated, the LED package 10 includes a plurality of LED chips 12-1, 12-2 that are provided on a submount 14. Separate lumiphoric material regions 16-1, 16-2 are registered with each LED chip 12-1, 12-2 to collectively form separate light emission zones or light emission surfaces of the LED package 10. A light-altering material 18, such as a light-reflective material in certain embodiments, is provided to peripherally surround all lateral edges of each of the lumiphoric material regions 16-1, 16-2. In typical manufacturing sequences, the light-altering material 18 may be formed prior to application of the lumiphoric material regions 16-1, 16-2 such that the light-altering material 18 forms walls or barriers that retain and segregate the lumiphoric material regions 16-1, 16-2.

Figure 1C:
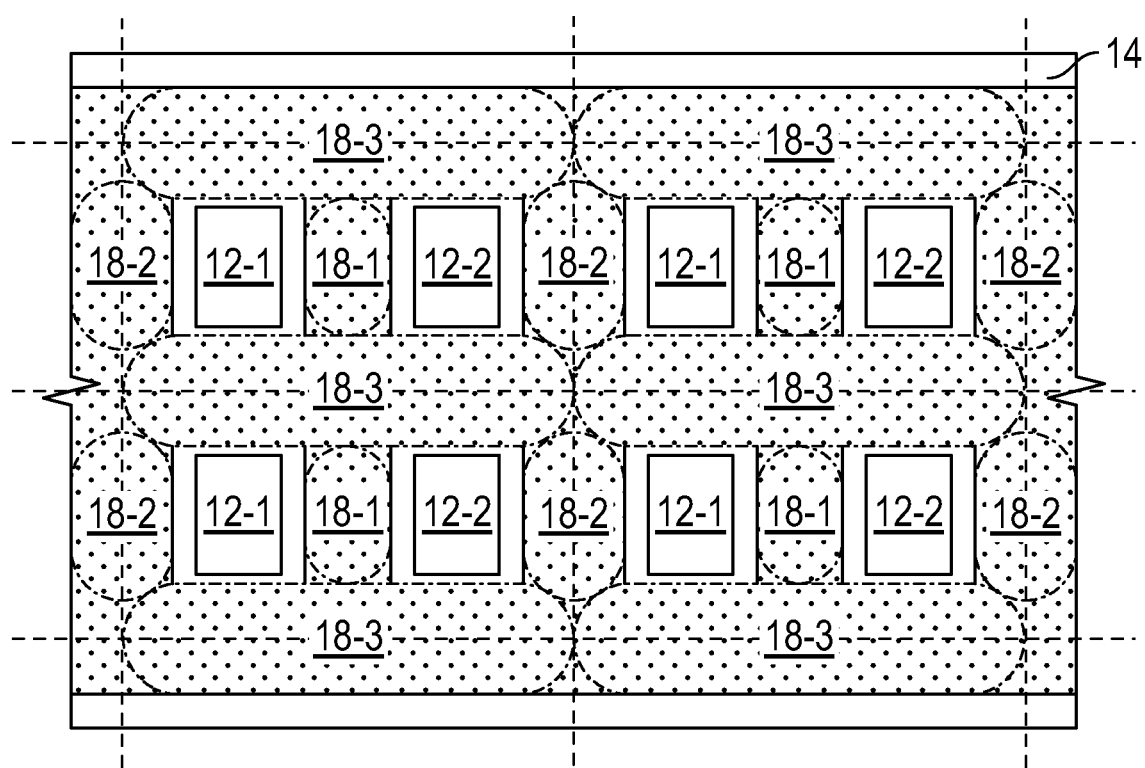
FIG. 1C is a top view of an array of LED packages that are similar to the typical LED package of FIG. 1A illustrating formation of light-altering materials for certain embodiments.

FIG. 1C is a top view of an array of LED packages that are similar to the LED package 10 of FIG. 1A illustrating formation of light-altering materials for certain embodiments. In order to form the light-altering material 18 as illustrated in FIG. 1A, a multiple step dispensing process is typically performed that sequentially provides a plurality of light-altering material segments 18-1 to 18-3 at various locations as indicated by the dashed-dot lines. As the individual light-altering material segments 18-1 to 18-3 are formed in close proximity to one another, the light-altering material segments 18-1 to 18-3 intersect with one another to form in a continuous manner around each of the LED chips 12-1, 12-2. Accordingly, the lumiphoric material regions 16-1, 16-2 of FIGS. 1A and 1B may then be formed over the LED chips 12-1, 12-2 and retained by the light-altering material segments 18-1 to 18-3.

The vertical and horizontal dashed lines in FIG. 1C indicate separation lines where individual LED packages (10 of FIGS. 1A and 1B) may be provided after singulation. In order to provide uniform shapes of the lumiphoric material regions 16-1, 16-2 of FIGS. 1A and 1B, the light-altering material segments 18-1 to 18-3 should be uniformly deposited. In this regard, overlap of the light-altering material segments 18-1 to 18-3 during the application process can lead to localized regions having too much light-altering material, thereby forming a non-uniform shape. For example, overlapping corners of light-altering material may be thicker relative to the submount 14, leading to non-uniform emission characteristics. Additionally, surface tension between different light-altering material segments 18-1 to 18-3 may induce various irregular shapes during the deposition process. As modern LED applications continue to evolve and LED packages are desired with smaller and smaller dimensions, it can be increasingly difficult to provide such arrangements of light-altering materials and corresponding lumiphoric materials.

Figure 2A:
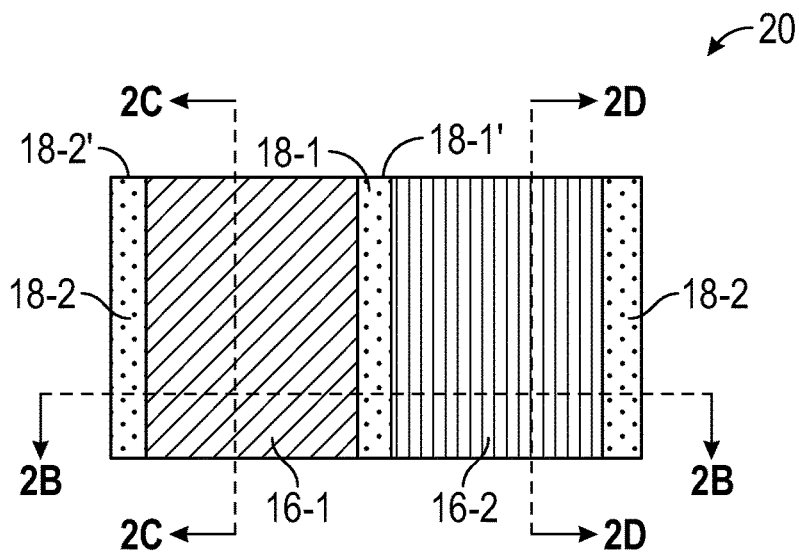
FIG. 2A is a top view of an LED package that is capable of providing different emission characteristics according to embodiments disclosed herein.
Figure 2B:
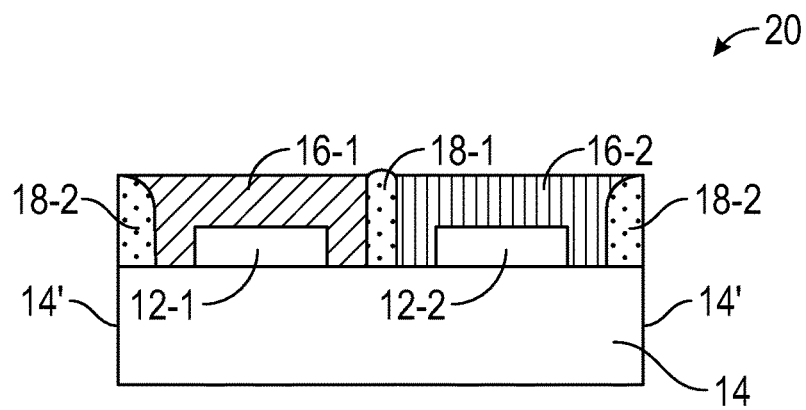
FIG. 2B is a side cross-sectional view of the LED package of FIG. 2A taken along the section line 2B-2B.
Figure 2C:
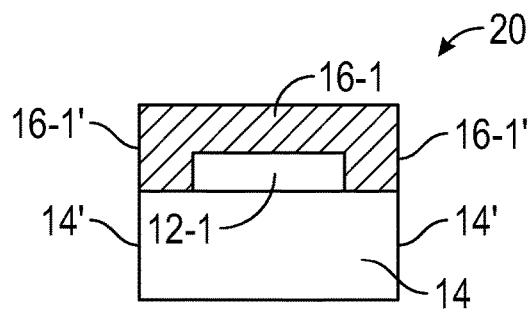
FIG. 2C is a side cross-sectional view of the LED package of FIG. 2A taken along the section line 2C-2C.
Figure 2D:
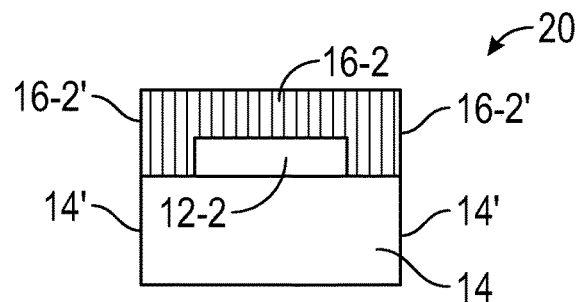
FIG. 2D is a side cross-sectional view of the LED package of FIG. 2A taken along the section line 2D-2D.

FIG. 2A is a top view of an LED package 20 that is capable of providing different emission characteristics according to embodiments disclosed herein. FIG. 2B is a side cross-sectional view of the LED package 20 of FIG. 2A taken along the section line 2B-2B. FIG. 2C is a side cross-sectional view of the LED package 20 of FIG. 2A taken along the section line 2C-2C. FIG. 2D is a side cross-sectional view of the LED package 20 of FIG. 2A taken along the section line 2D-2D. As illustrated, different light-altering material segments 18-1, 18-2 are arranged to define certain but not all boundaries of the lumiphoric material regions 16-1, 16-2. Notably, the light-altering material segments 18-1, 18-2 are arranged to form nonintersecting lines, such that the shape of each individual light-altering material segment 18-1, 18-2 is not influenced by others of the light-altering material segments 18-1, 18-2. In this regard, the light-altering material segments 18-2 form perimeter walls and the light-altering material segment 18-1 forms an interior wall between the lumiphoric material regions 16-1, 16-2. As illustrated in FIGS. 2B-2D, one or more peripheral edges 16-1', 16-2' of the lumiphoric material regions 16-1, 16-2 may be arranged to be vertically aligned with one or more peripheral edges 14' of the submount 14. Additionally, peripheral edges 18-1', 18-2' of the light-altering material segments 18-1, 18-2 are vertically aligned with the same one or more peripheral edges of the submount 14 as the lumiphoric material regions 16-1, 16-2 while the light-altering material segments 18-2 are arranged to extend along a different peripheral edge of the submount 14. In certain embodiments, one or more peripheral edges of one or more of the lumiphoric material regions 16-1, 16-2 and the light-altering material segments 18-1, 18-2 are vertically aligned within five microns (μm) or less of at least one peripheral edge of the submount 14. In certain embodiments, one or more peripheral edges of one or more of the lumiphoric material regions 16-1, 16-2 and the light-altering material segments 18-1, 18-2 are vertically aligned and coplanar with at least one peripheral edge of the submount 14.

As compared with the LED package 10 of FIG. 1A where lumiphoric material regions 16-1, 16-2 are entirely surrounded by the light-altering material 18, the lumiphoric material regions 16-1, 16-2 of the LED package 20 may be provided with increased size relative to the submount 14. As such, surface areas of light emission surfaces of the LED package 20 are increased. In this regard, for similar overall dimensions, the LED package 20 of FIG. 2A may provide increased brightness or lumen output as compared to the LED package 10 of FIG. 1A. In one example, lumen output or flux measurements were collected for a first sample configured according to the LED package 10 of FIG. 1A and a second sample configured according to the LED package 20 of FIG. 2A. Each sample was assembled with submount dimensions of approximately a 1.7 mm width and a 3.3 mm length and having similarly configured LED chips and corresponding lumiphoric material regions 16-1, 16-2. By arranging the lumiphoric material regions 16-1, 16-2 in vertical alignment with two edges of the submount 14 as illustrated in FIG. 2A, lumen output measurements increased by at least 3% and at least 4% for each of the lumiphoric material regions 16-1, 16-2 and corresponding LED chips 12-1, 12-2 of the second sample.

In certain embodiments, the arrangement of the lumiphoric material regions 16-1, 16-2 may allow the LED package 20 to be configured with reduced dimensions. For example, the lumiphoric material regions 16-1, 16-2 may comprise widths as measured between the light-altering material segments 18-1, 18-2 across the submount 14 of 2 mm or less, or 1.5 mm or less, or 1 mm or less in various embodiments. Additionally, the lumiphoric material regions 16-1, 16-2 may comprise lengths as measured in directions parallel to the light-altering material segments 18-1, 18-2 across the submount 14 of 3 mm or less, or 1.5 mm or less, or 1 mm or less in various embodiments. By way of example, in a particular embodiment, the lumiphoric material regions 16-1, 16-2 may each comprise widths of 1 mm or less and lengths of 1.5 mm or less. Widths of one or more of the light-altering material segments 18-1, 18-2 may be formed with larger or smaller values than the widths of the lumiphoric material regions 16-1, 16-2. In certain embodiments, a ratio of the width of one or more of the lumiphoric material regions 16-1, 16-2 to a width of one or more of the light-altering material segments 18-1, 18-2 may include a range of 3:1 to 1:10.

While the lumiphoric material regions 16-1, 16-2 are illustrated with linear shapes entirely across the LED package 20 (or the submount 14) in the top view of FIG. 2A, other shapes are possible. For example, one or more of the light-altering material segments 18-1, 18-2 may be formed with nonlinear or curved shapes, thereby forming one or more of the lumiphoric material regions 16-1, 16-2 with corresponding non-linear or curved shapes. In certain embodiments, one or more of the lumiphoric material regions 16-1, 16-2 may form a curved shape or any number of polygon shapes. In certain embodiments, one or more of the light-altering material segments 18-1, 18-2 may be arranged along one, two, or three perimeter or peripheral edges of one or more of the lumiphoric material regions 16-1, 16-2.

In FIGS. 2A-2D, the LED chips 12-1, 12-2 may comprise any number of chip geometries, including one or more of vertical and lateral geometries. In certain embodiments, one or more of the LED chips 12-1, 12-2 may be electrically connected by way of one or more wirebonds. In other embodiments, one or more of the LED chips 12-1, 12-2 may be provided with a flip-chip arrangement where electrical connections are made by flip-chip mounting one or more of the LED chips 12-1, 12-2 to electrical traces on the submount 14. The lumiphoric material regions 16-1, 16-2 may be formed over the LED chips 12-1, 12-2 after the light-altering material segments 18-1, 18-2 and before singulation of individual LED packages 20. In other embodiments, the lumiphoric material regions 16-1, 16-2 may be formed over the LED chips 12-1, 12-2 after singulation of individual LED packages 20. In certain embodiments, the lumiphoric material regions 16-1, 16-2 may be formed by one or more of dispensing or spraying to form one or more dispensed or spray-coated lumiphoric materials. In other embodiments, one or more of the lumiphoric material regions 16-1, 16-2 may be provided as a pre-formed lumiphoric material structure that is arranged over one or more of the LED chips 12-1, 12-2. For example, at least one of the lumiphoric material regions 16-1, 16-2 may comprise a flexible sheet of lumiphoric materials in a flexible binder such as silicone. In this manner, one or more of the flexible sheets may be applied over the LED chips 12-1, 12-2 before or after singulation of individual LED packages 20. In other embodiments, such pre-formed structures may comprise lumiphoric materials provided on or within a rigid support or superstrate. For example, the lumiphoric material regions 16-1, 16-2 may comprise lumiphoric materials coated on a transparent sheet of glass, sapphire, silicon carbide or the like. In other examples, the lumiphoric material regions 16-1, 16-2 may be provided as a ceramic plate. In embodiments where the lumiphoric material regions 16-1, 16-2 are provided as pre-formed structures that are arranged after singulation of individual LED packages 20, the pre-formed structures may be separately formed with lateral dimensions configured to provide vertical alignment with the submount 14.

Figure 3A:
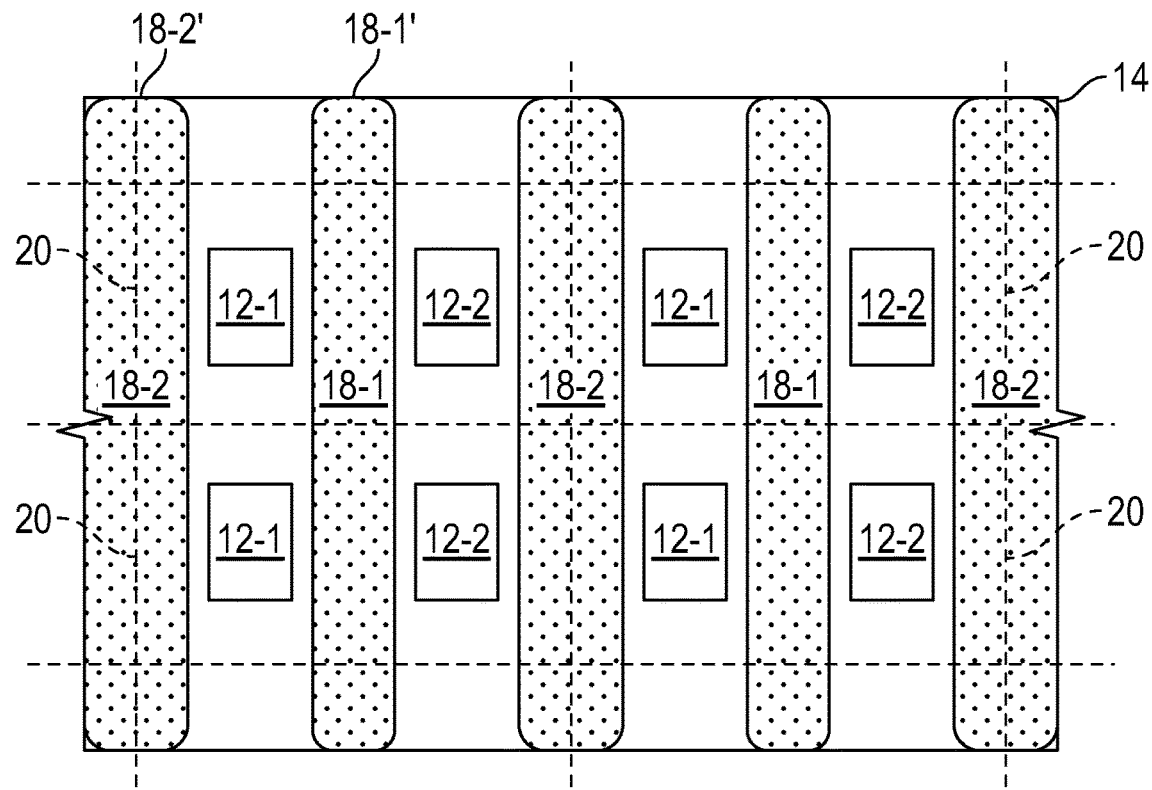
FIGS. 3A and 3B are top views of an array of the LED packages of FIG. 2A illustrating formation of light-altering materials and lumiphoric materials.
Figure 3B:
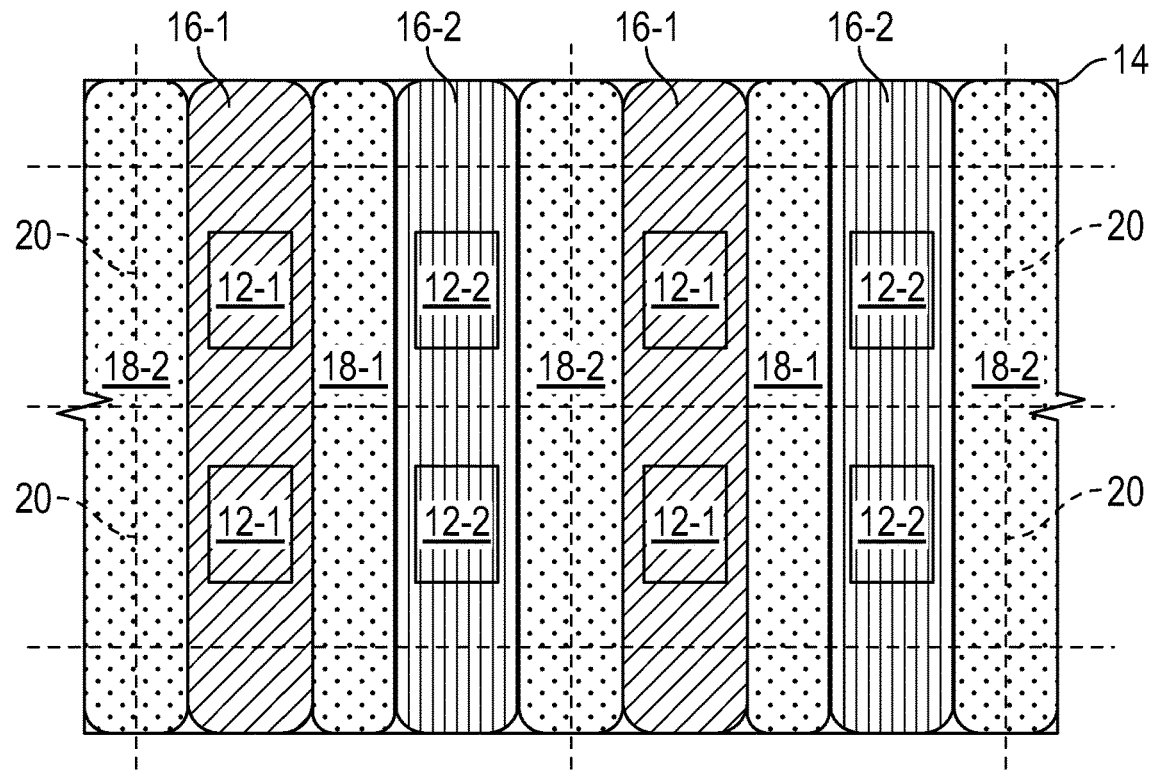

FIGS. 3A and 3B are top views of an array of the LED packages 20 of FIG. 2A illustrating formation of light-altering materials and lumiphoric materials for. In FIG. 3A, the vertical and horizontal dashed lines indicate separation lines where individual LED packages 20 may be provided after singulation. For illustrative purposes, FIG. 3A represents an embodiment where four of such LED packages may be formed on a common submount 14 or panel before singulation. It is understood that in practice, many more LED packages may be formed on a common submount 14 before singulation. As illustrated in FIG. 3A, a plurality of the LED chips 12-1, 12-2 are mounted in an array across the submount 14. Light-altering material segments 18-1, 18-2 may then be dispensed or otherwise formed in non-intersecting lines that are spaced apart and alternate across the submount 14. As illustrated, the light-altering material segments 18-1 may form interior walls between pairs of LED chips 12-1, 12-2 while the light-altering material segments 18-2 may form perimeter walls that are registered along the separating lines. In this manner, shapes of individual ones of the light-altering material segments 18-1, 18-2 may not be influenced by others of the light-altering material segments 18-1, 18-2. Additionally, the light-altering material segments 18-1, 18-2 may be formed with fewer deposition steps than the embodiments illustrated in FIG. 1C.

Turning to FIG. 3B, the lumiphoric material regions 16-1, 16-2 may then be formed over the LED chips 12-1, 12-2 such that shapes of the lumiphoric material regions 16-1, 16-2 may be at least partially defined by the light-altering material segments 18-1, 18-2. After singulation along the vertical and horizontal dashed lines, a plurality of LED packages 20 may be formed. By providing the light-altering material segments 18-1, 18-2 in nonintersecting lines, the lumiphoric material regions 16-1, 16-2 may also be formed with fewer deposition steps. For example, a single deposition step for either of the lumiphoric material regions 16-1, 16-2 may form lumiphoric materials across locations for a plurality of LED packages. By forming the light-altering material segments 18-1, 18-2 and the lumiphoric material regions 16-1, 16-2 in such a manner, one or more peripheral edges of the light-altering material segments 18-1, 18-2 and the lumiphoric material regions 16-1, 16-2 may be vertically aligned with at least one peripheral edge of the submount 14 after singulation.

Figure 4A:
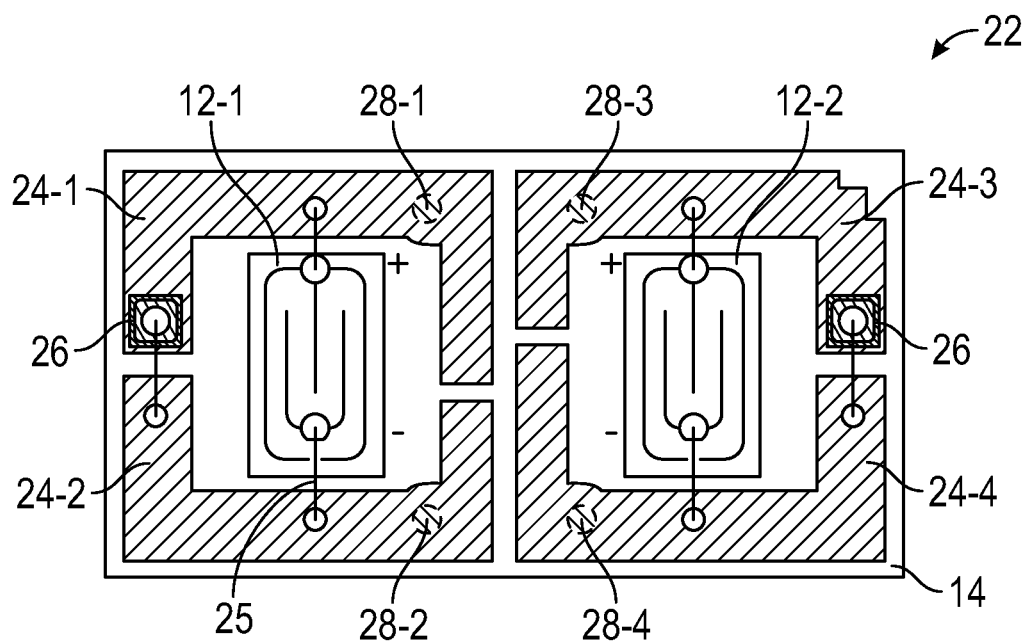
FIG. 4A is a top view of a partially assembled LED package according to certain embodiments.

FIG. 4A is a top view of a partially assembled LED package 22 according to certain embodiments. The LED package 22 includes the LED chips 12-1, 12-2 arranged on the submount 14 as previously described. A plurality of metal traces 24-1 to 24-4 are formed on a same face of the submount 14 on which the LED chips 12-1, 12-2 are mounted to provide separate anode and cathode connections for each of the LED chips 12-1, 12-2. For example, the metal traces 24-1, 24-2 may form respective anode and cathode connections for the LED chip 12-1 and the metal traces 24-3, 24-4 may form respective anode and cathode connections for the LED chip 12-2. Each of the metal traces 24-1 to 24-4 may include a continuous metal or a stack of metals formed on a surface of the submount 14, and each metal trace 24-1 to 24-4 may be discontinuous with others of the metal traces 24-1 to 24-4. In certain embodiments, the metal traces 24-1 to 24-4 form separate electrical connections that are configured to separately control each of the LED chips 12-1, 12-2 independently from one another.

The metal traces 24-1 to 24-4 may include any number of electrically conductive materials, such as at least one of the following: copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the metal trace 24-1 to 24-4 may include a first layer of Cu or Ni followed by a layer of ENEPIG or ENIG that conformally covers a top and sidewalls of the first layer of Cu or Ni. In certain embodiments, electrical connections between the LED chips 12-1, 12-2 and the metal traces 24-1 to 24-4 may be provided by a number of wirebonds 25.

The LED package 22 may further include one or more electrostatic discharge (ESD) chips 26 that are electrically connected between pairs of the metal traces 24-1, 24-2 and/or 24-3, 24-4 that correspond to anode and cathode connections for each of the LED chips 12-1, 12-2. In certain embodiments, one or more conductive vias 28-1 to 28-4 are provided that extend through the submount 14 to electrically connect one or more of the metal traces 24-1 to 24-4 to a back face or surface of the submount 14 that is opposite the face or surface of the submount 14 on which the LED chips 12-1, 12-2 are mounted. In this manner, external electrical connections to the LED package 22 may be connected on a backside of the LED package 22 and the one or more conductive vias 28-1 to 28-4 may form portions of electrically conductive paths to the LED chips 12-1, 12-2. In other embodiments, external electrical connections to the LED package 22 may be provided on a same surface or face of the submount 14 as the LED chips 12-1, 12-2.

Figure 4B:
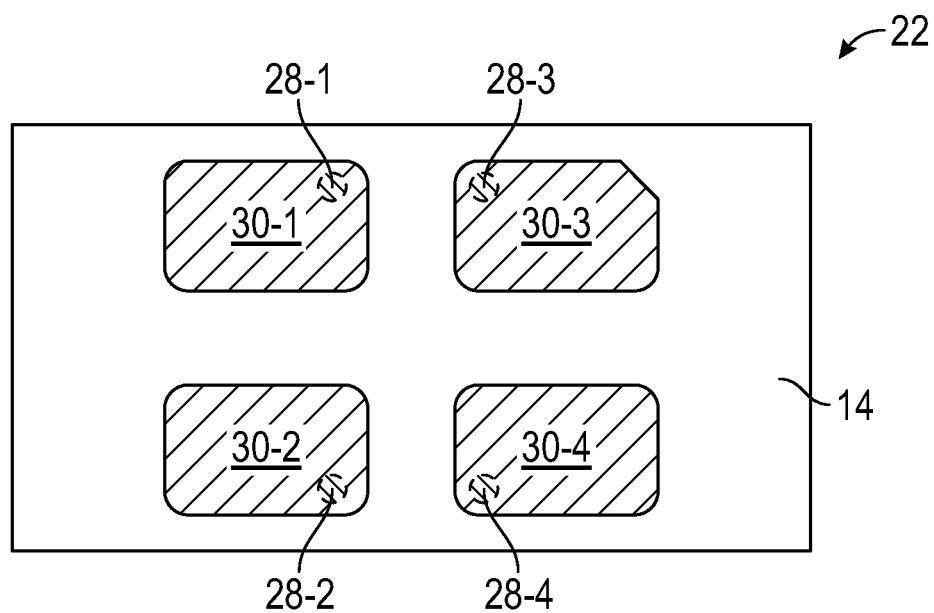
FIG. 4B is a backside or bottom view of the partially assembled LED package of FIG. 4A.

FIG. 4B is a backside or bottom view of the partially assembled LED package 22 of FIG. 4A. As illustrated, a plurality of package contacts 30-1 to 30-4 are arranged on the back face of the submount 14. In this manner, the backside of the submount 14 forms a package mounting face that is configured for mounting the LED package 22 to another surface, such as a PCB, and external electrical connections for the LED package 22 are provided by mounting the package contacts 30-1 to 30-4 to corresponding electrical pads or traces of another surface. The conductive vias 28-1 to 28-4 are arranged through the submount 14 to provide the electrical paths between the package contacts 30-1 to 30-4 and corresponding ones of the metal traces 24-1 to 24-4 of FIG. 8A.

Figure 4C:
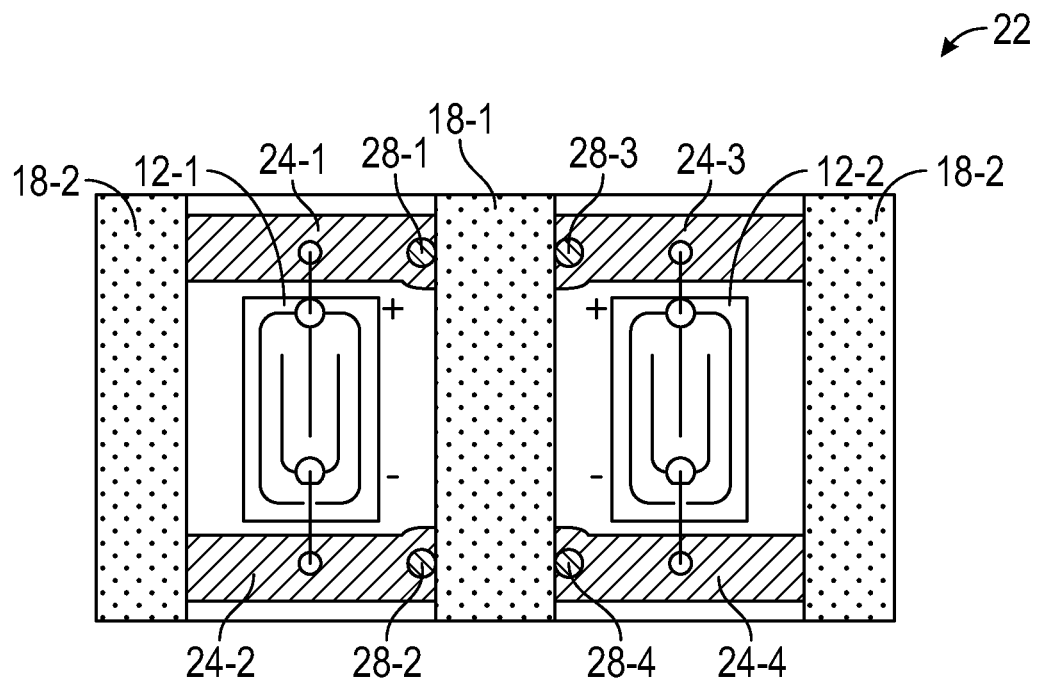
FIG. 4C is a topside view of the LED package of FIG. 4A with the addition of light-altering material segments according to certain embodiments.
Figure 4D:
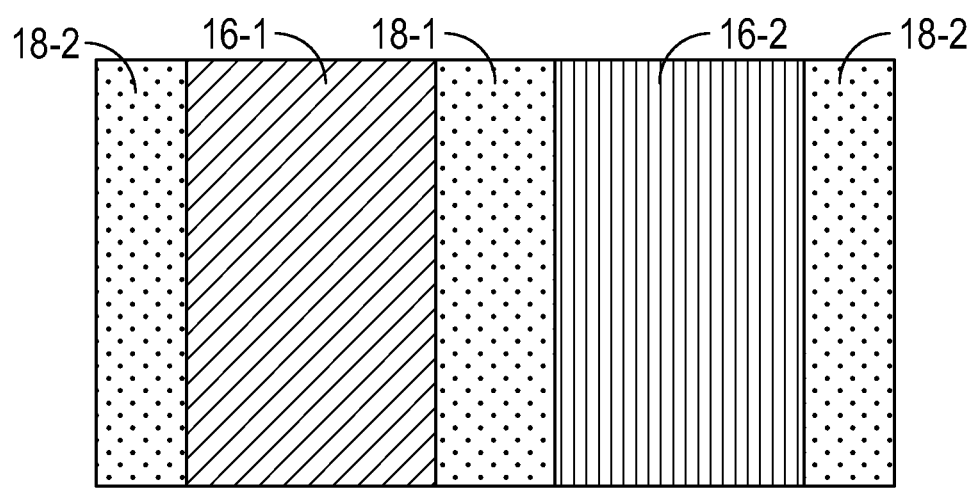
FIG. 4D is a topside view of the LED package of FIG. 4C with the addition of lumiphoric material regions according to certain embodiments.

FIG. 4C is a topside view of the LED package 22 with the light-altering material segments 18-1, 18-2 as previously described. Notably, one or more of the light-altering material segments 18-1, 18-2 are arranged to cover the ESD chips 26 of FIG. 4A and portions of the metal traces 24-1 to 24-4. In certain embodiments, the one or more of the light-altering material segments 18-1, 18-2 are arranged to cover only portions of the metal traces 24-1 to 24-4. As illustrated in FIG. 4D, the lumiphoric material regions 16-1, 16-2 are arranged to cover the LED chips 12-1, 12-2 of FIG. 4C as well as remaining portions of the metal traces 24-1 to 24-4 and the submount 14 that are uncovered by the light-altering material segments 18-1, 18-2.

Figure 4E:
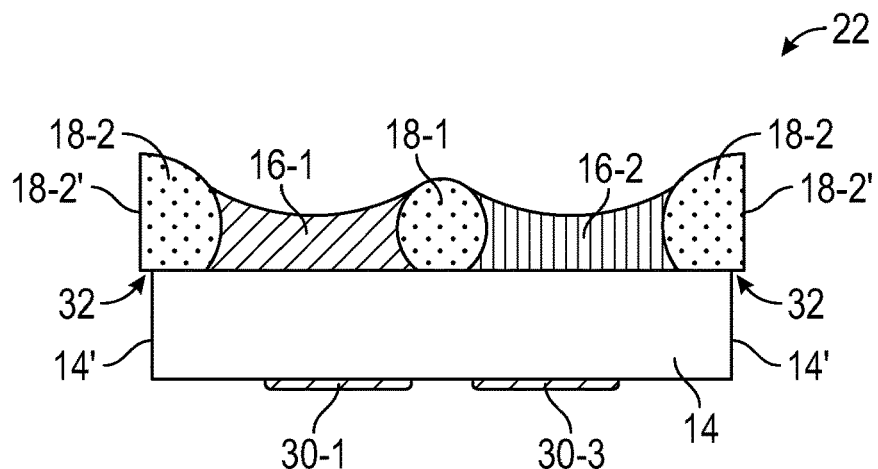
FIG. 4E is a side view of the LED package of FIG. 4A.

FIG. 4E is a side view of the LED package 22 of FIG. 4A. As illustrated, the light-altering material segment 18-1 forms an interior wall between the lumiphoric material regions 16-1, 16-2, and the light-altering material segments 18-2 form perimeter walls on the submount 14. In certain embodiments, the light-altering material segments 18-1, 18-2 are dispensed to form curved top and/or side surfaces at least partially due to gravity and surface tension with the submount 14. The light-altering material segments 18-1, 18-2 may be dispensed through a circular tip in certain applications that contributes to forming the curved top and/or side surfaces along with a dispensed thickness and/or surface tension with the submount 14. In other embodiments, the light-altering material segments 18-1, 18-2 may be dispensed through other shaped-tips, such as a square-shaped tip that may contribute to more one or more planar, vertical, and straight edge shapes. As further illustrated in FIG. 4E, the lumiphoric material regions 16-1, 16-2 may fill spaces between the light-altering material segments 18-1, 18-2. Additionally, due at least partially to gravity and surface tension with the light-altering material segments 18-1, 18-2, the lumiphoric material regions 16-1, 16-2 may form curved top surfaces that may include a concave or convex meniscus relative to the submount 14. For embodiments where the lumiphoric material regions 16-1, 16-2 comprise lumiphoric materials within a binder, settling of lumiphoric materials within the binder may be allowed to occur after dispensing and before curing. In this manner, the lumiphoric material regions 16-1, 16-2 may comprise a non-uniform distribution of lumiphoric materials including embodiments where a higher number of lumiphoric materials are arranged closer to the LED chips 12-1, 12-2 than at surfaces of the lumiphoric material regions 16-1, 16-2 that are spaced away from the submount 14.

In certain embodiments, the separation process for singulating the LED package 22 may include one or more cutting steps along each edge or side of the LED package 22 to separate the LED package 22 from a larger panel. In certain embodiments, the cutting step may be configured to cut entirely through the light-altering material segments 18-1, 18-2 and the submount 14 in a single step. During the cutting step, the light-altering material segments 18-1, 18-2 may initially be compressed by a saw blade and then expanded after removal of the saw blade to form an overhang 32 between peripheral edges (e.g., 18-2') of the light-altering material segments 18-1, 18-2 and one or more peripheral edges 14' of the submount 14. In this manner, the peripheral edge 18-2' of the light-altering material segment 18-2 may be vertically aligned within five μm or less of at least one peripheral edge 14' of the submount. In certain embodiments, the cutting process may form one or more overhangs 32 having the same or similar dimensions between one or more peripheral edges of the submount 14 and one or more peripheral edges of the light-altering material segment 18-1 and/or the lumiphoric material regions 16-1, 16-2.

In other embodiments, a two-step cutting process may be used where each cutting step is tailored to separate a different portion of the LED package 22 from a larger panel. For example, a first cutting step may be applied to a top side of the LED package 22 to define peripheral edges (e.g., 18-2') of the light-altering material segments 18-1, 18-2 and the lumiphoric material regions 16-1, 16-2. A second cutting step may then be applied to define peripheral edges 14' of the submount 14. In certain embodiments, the overhang 32 may be formed due to differences in the two cutting steps. For example, the first cutting step may use a saw blade having a narrower width than a saw blade used for the second cutting step. In this manner, a distance that the light-altering material segments 18-1, 18-2 are positioned from the peripheral edges 14' of the submount 14 may be at least partially determined by the differences in saw blade widths. As such, the overhang 32 may be formed with dimensions such that the peripheral edge 18-2' of the light-altering material segment 18-2 may be vertically aligned within fifty μm or less, or twenty five μm or less, or 10 μm or less, or five μm or less of at least one peripheral edge 14' of the submount 14. In certain embodiments, peripheral edges of the lumiphoric material regions 16-1, 16-2 may also be formed with a similar overhang dimensions relative to the peripheral edges 14' of the submount 14.

Figure 4F:
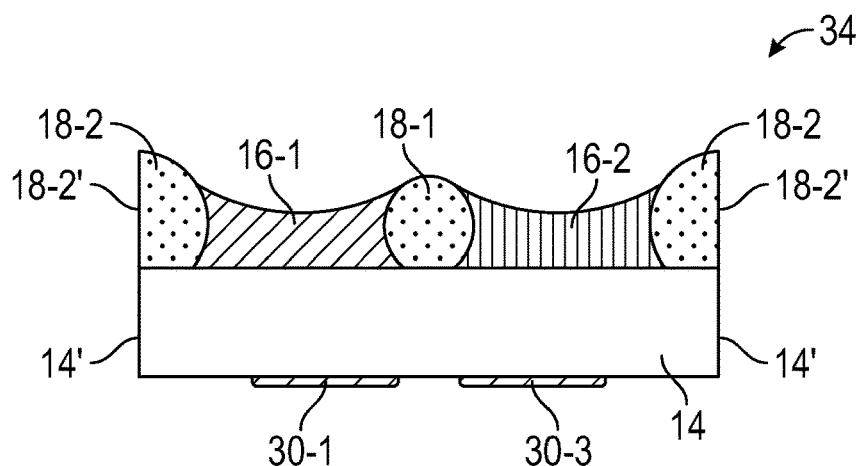
FIG. 4F is a side view of an LED package that is similar to the LED package of FIG. 4E and further includes vertically aligned and coplanar peripheral edges.

FIG. 4F is a side view of an LED package 34 that is similar to the LED package 22 of FIG. 4E and further includes vertically aligned and coplanar peripheral edges. The LED package 34 generally includes the same elements as described above for FIG. 4E. In FIG. 4F, peripheral edges (e.g., 18-2') of the light-altering material segments 18-1, 18-2 and peripheral edges of the lumiphoric material regions 16-1, 16-2 may be formed to be vertically aligned and coplanar with one or more peripheral edges 14' of the submount 14. The coplanar peripheral edges may be formed by the single cutting step or by a multiple-step cutting process that is applied to each edge of the LED package 34 during singulation as described above.

Figure 4G:
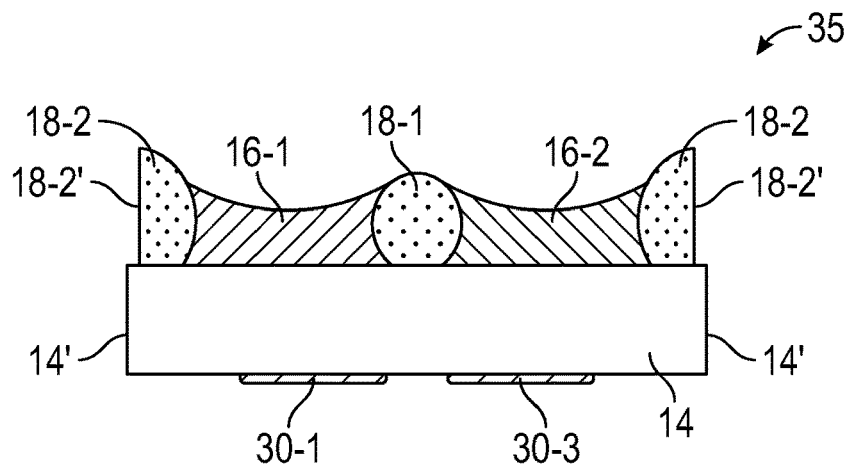
FIG. 4G is a side view of an LED package that is similar to the LED package of FIG. 4E and further includes light-altering material segments that are inset from peripheral edges of the submount.

FIG. 4G is a side view of an LED package 35 that is similar to the LED package 22 of FIG. 4E and further includes light-altering material segments 18-1, 18-2 that are inset from the peripheral edges 14' of the submount 14. In certain embodiments, the light-altering material segments 18-1, 18-2 may contract after cutting such that peripheral edges (e.g., 18-2') of the light-altering material segments 18-1, 18-2 are inset from one or more peripheral edges 14' of the submount 14. In this manner, the peripheral edge 18-2' of the light-altering material segment 18-2 may be vertically aligned within five μm or less of at least one peripheral edge 14' of the submount 14. In other embodiments, a two-step cutting process may be used. For example, the first cutting step for the light-altering materials 18-1, 18-2 and the lumiphoric material regions 16-1, 16-2 may use a saw blade having a larger width than a saw blade used for the second cutting step that passed through the submount 14. In this manner, a distance that the light-altering material segments 18-1, 18-2 are inset from the peripheral edges 14' of the submount 14 may be at least partially determined by the differences in saw blade widths. As such, the peripheral edges (e.g., 18-2') of the light-altering material segments 18-1, 18-2 may be vertically aligned within one hundred μm or less, or fifty μm or less, or twenty-five μm or less, or ten μm or less, or five μm or less of at least one peripheral edge 14' of the submount 14. In certain embodiments, peripheral edges of the lumiphoric material regions 16-1, 16-2 may be inset from the peripheral edges 14' of the submount 14 in a similar manner as the light-altering material segments 18-1, 18-2.

Figure 5A:
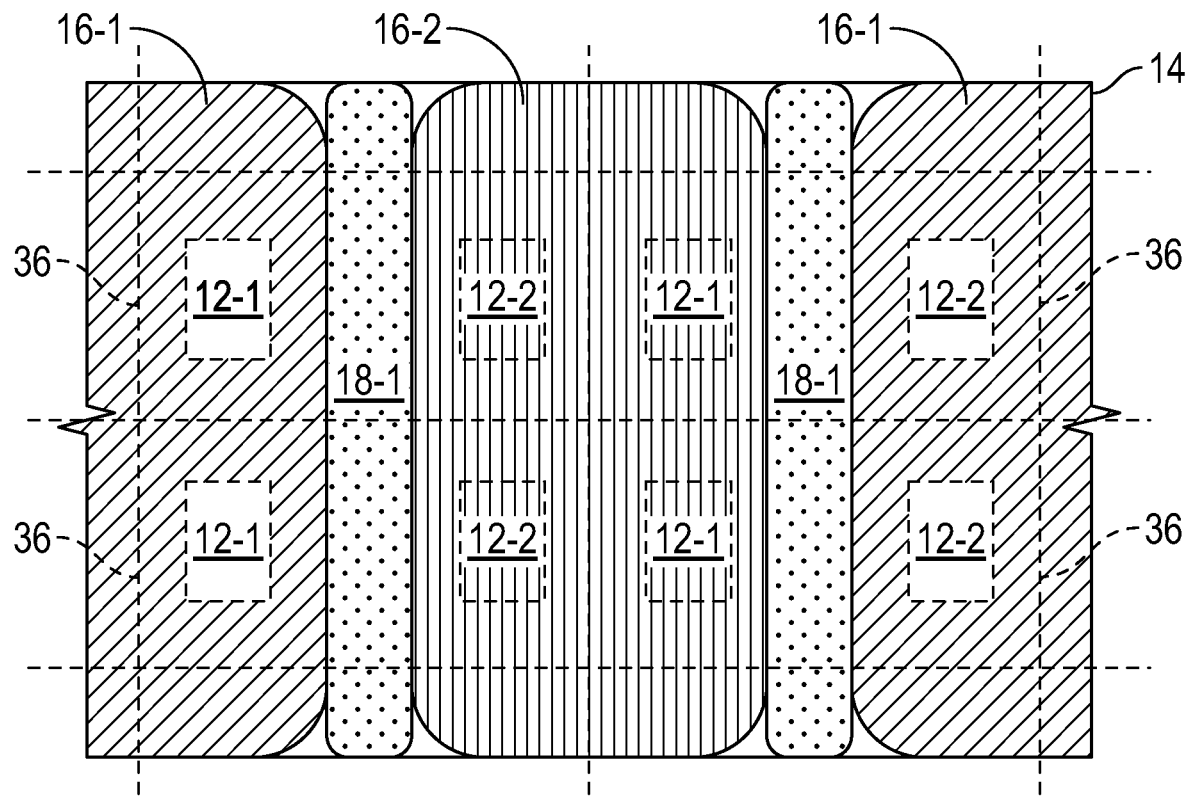
FIGS. 5A and 5B are top views of an array of LED packages illustrating formation of light-altering materials and lumiphoric materials according to certain embodiments.
Figure 5B:
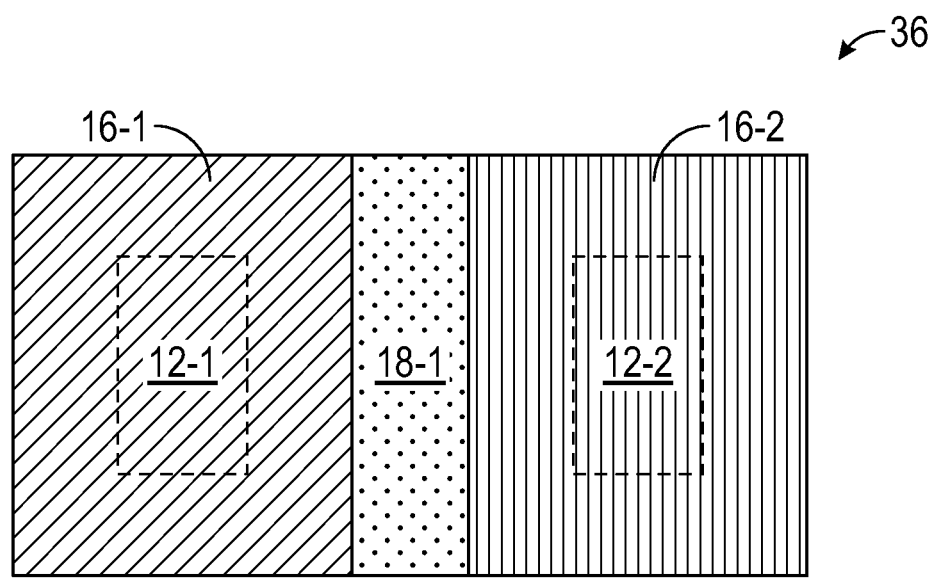

FIGS. 5A and 5B are top views of an array of LED packages 36 illustrating formation of light-altering materials and lumiphoric materials according to certain embodiments. In FIG. 5A, the vertical and horizontal dashed lines indicate separation lines where individual LED packages 36 as illustrated in FIG. 5B may be provided after singulation. For illustrative purposes, FIG. 5A represents an embodiment where four of such LED packages 36 may be formed on a common submount 14 before singulation. It is understood that in practice, many more LED packages 36 may be formed on a common submount 14 before singulation. As illustrated in FIG. 5A, a plurality of LED chips 12-1, 12-2 are mounted in an array across the submount 14. Light-altering material segments 18-1 are provided between pairs of the LED chips 12-1, 12-2 to form an interior wall that separates and defines the lumiphoric material regions 16-1, 16-2. Notably, perimeter wall segments of the light-altering materials (e.g., 18-2 of FIGS. 3A and 3B) are omitted in FIG. 5A, thereby reducing manufacturing steps. In certain embodiments, the lumiphoric material regions 16-1, 16-2 are provided to cover the areas of the submount 14 that are uncovered by the light-altering material segments 18-1. For singulation, the individual LED packages 36 are formed by separating the submount 14 along the separation lines, at least some of which extend through portions of the lumiphoric material regions 16-1, 16-2. Accordingly, the LED package 36 of FIG. 5B may be formed with a single light-altering material segment 18-1 that divides the lumiphoric material regions 16-1, 16-2 from one another.

Figure 6:
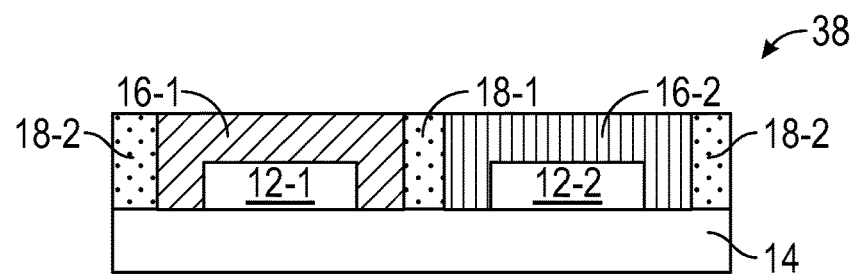
FIG. 6 is a side view of an LED package that includes lumiphoric material regions that are separated by alternative configurations of light-altering material segments according to certain embodiments.
Figure 7:
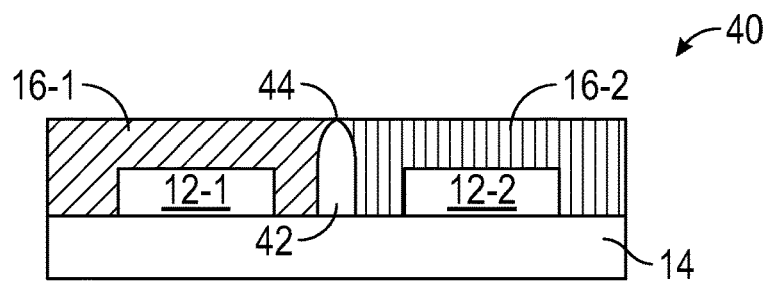
FIG. 7 is a side view of an LED package that includes lumiphoric material regions that are separated by a divider according to certain embodiments.

FIG. 6 is a side view of an LED package 38 that includes the lumiphoric material regions 16-1, 16-2 that are separated by alternative configurations of the light-altering material segments 18-1, 18-2. In certain embodiments, the light-altering material segments 18-1, 18-2 may be provided as pre-formed structures that are attached to the submount 14 before application of the lumiphoric material regions 16-1, 16-2. In certain embodiments, the light-altering material segments 18-1, 18-2 may be shaped and cured before mounting on the submount 14. In certain embodiments, the light-altering material segments 18-1, 18-2 may comprise ceramic or plastic materials with pre-formed shapes. In other embodiments, the light-altering material segments 18-1, 18-2 may be formed as continuous portions of the submount 14. For example, portions of a thicker submount 14 may be etched, machined, or otherwise removed to form cavities configured for mounting the LED chips 12-1, 12-2 and for receiving the lumiphoric material regions 16-1, 16-2. In such arrangements, the light-altering material segments 18-1, 18-2 may correspond with portions of the submount 14 where material has not been removed. As illustrated in FIG. 7, the light-altering material segments 18-1, 18-2 may be formed with planar top surfaces.

FIG. 7 is a side view of an LED package 40 that includes the lumiphoric material regions 16-1, 16-2 that are separated by a divider 42. In certain embodiments, the divider 42 may be formed in a similar manner and in similar locations to the light-altering material segments (e.g., 18-1, 18-2 in FIG. 2A)

as previously described. The divider 42 may comprise a transparent material configured to allow light from either the LED chips 12-1, 12-2 or the lumiphoric material regions 16-1, 16-2, to pass through. In certain embodiments, the divider 42 may be formed with a height that is the same or less than heights of the lumiphoric material regions 16-1, 16-2 relative to the submount 14. In this manner, portions of the lumiphoric material regions 16-1, 16-2 may extend over curved upper surfaces of the divider 42. In certain embodiments, an interface 44 is formed between the lumiphoric material regions 16-1, 16-2 that is above the divider 42. Accordingly, an emission surface of the LED package 40 may be formed by only the lumiphoric material regions 16-1, 16-2. In such embodiments, the divider 42 may be provided to at least partially define lateral boundaries between the lumiphoric material regions 16-1, 16-2. In certain embodiments, the divider 42 may comprise light-altering materials.

Figure 8:
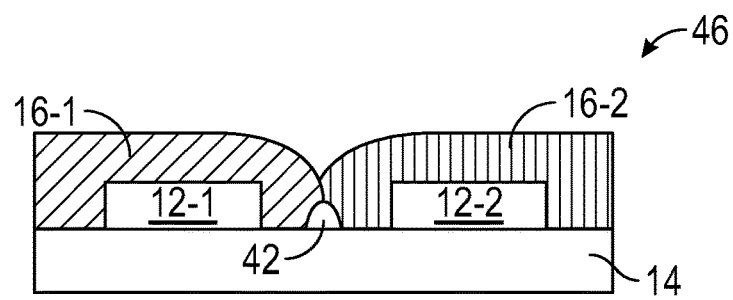
FIG. 8 is a side view of an LED package where a divider that is arranged between lumiphoric material regions has a reduced height relative to the submount according to certain embodiments.

FIG. 8 is a side view of an LED package 46 where the divider 42 arranged between the lumiphoric material regions 16-1, 16-2 has a reduced height relative to the submount 14. In certain embodiments, the divider 42 may comprise a height that is less than one or more heights of the lumiphoric material regions 16-1, 16-2 relative to the submount 14. In one example, the divider 42 may be formed with a height that is the same or less than a height of the LED chips 12-1, 12-2. In this manner, the divider 42 may form a protrusion that is arranged to at least partially define a shape of the lumiphoric material regions 16-1, 16-2 by surface tension during dispensing. For example, a first lumiphoric material region 16-1 may be dispensed over the LED chip 12-1 and adjacent portions of the submount 14 and held in place by surface tension with the divider 42. In a subsequent step, a second lumiphoric material region 16-2 may then be dispensed over the LED chip 12-2 and adjacent portions of the submount 14 and held in place by one or more of the divider 42 and the first lumiphoric material region 16-1. By arranging the divider 42 in such a manner, a lateral spacing between the first and second lumiphoric material regions 16-1, 16-2 may be reduced. In certain embodiments, the divider 42 may comprise light-altering materials. In certain embodiments, the divider 42 may comprise a continuous portion of the submount 14 that protrudes upward.

Figure 9:
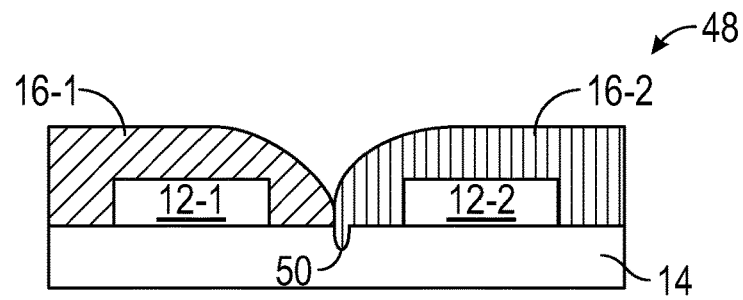
FIG. 9 is a side view of an LED package where a recess is formed in a submount such that the recess is arranged between lumiphoric material regions according to certain embodiments.

FIG. 9 is a side view of an LED package 48 where the submount 14 forms a recess 50 that is arranged between the lumiphoric material regions 16-1, 16-2. In certain embodiments, the recess 50 forms a depression or a trench that extends along one or more portions of the submount 14 in a manner similar to the light-altering material segments 18-1, 18-2 of FIG. 2A. The recess 50 may at least partially define a shape of the lumiphoric material regions 16-1, 16-2 by surface tension during dispensing. For example, the first lumiphoric material region 16-1 may be dispensed over the LED chip 12-1 and adjacent portions of the submount 14 and held in place by surface tension with the recess 50. In a subsequent step, the second lumiphoric material region 16-2 may then be dispensed over the LED chip 12-2 and adjacent portions of the submount 14 and held in place by one or more of the recess 50 and the first lumiphoric material region 16-1.

Figure 10A:
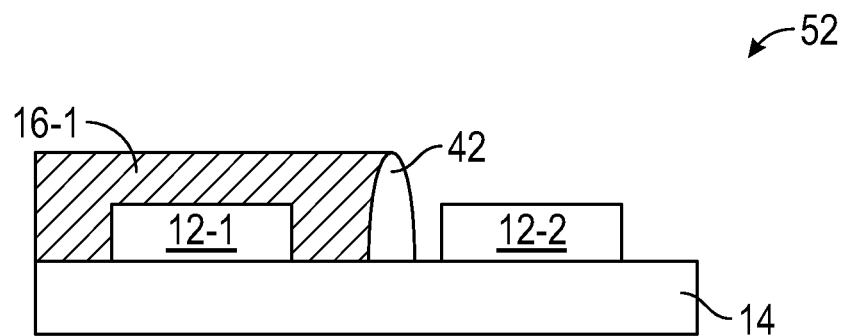
FIGS. 10A-10C are side view illustrations of an LED package at various fabrication steps where a divider is temporarily arranged to at least partially define a shape of one or more lumiphoric material regions according to certain embodiments.
Figure 10B:
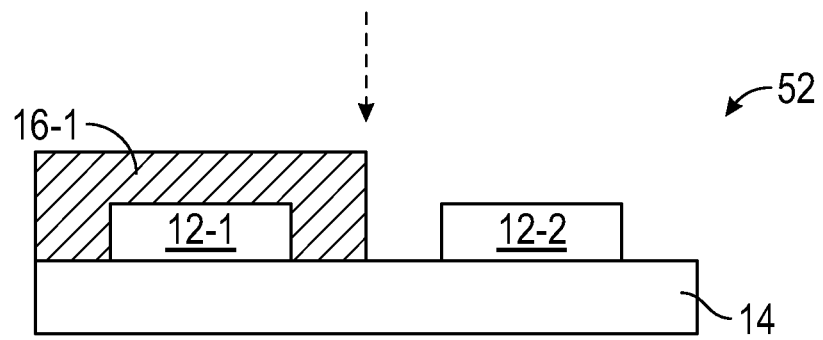
Figure 10C:
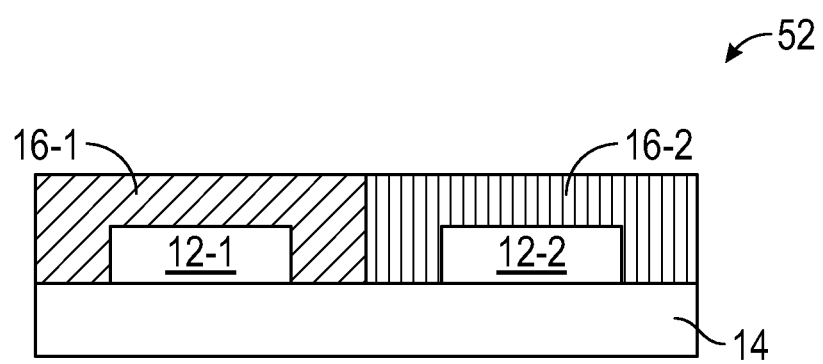

FIGS. 10A-10C are side view illustrations of an LED package 52 at various fabrication steps where the divider 42 is temporarily arranged to at least partially define a shape of one or more of the lumiphoric material regions 16-1, 16-2. In FIG. 10A, the divider 42 is provided on a surface of the submount 14 and arranged between the LED chips 12-1, 12-2 as previously described. The first lumiphoric material region 16-1 may then be formed over the LED chip 12-1 and adjacent portions of the submount 14 that extend to the divider 42. As indicated by the dashed arrow in FIG. 10B, the divider 42 may then be removed. In certain embodiments, removal of the divider 42 may comprise a mechanical removal step, such as sawing or the like. As illustrated in FIG. 10C, the second lumiphoric material region 16-2 may then be formed over the LED chip 12-2 and over portions of the submount 14 that extend to the first lumiphoric material region 16-1. Accordingly, the LED package 52 may be provided without the divider 42, or light-altering material segments 18-1, 18-2 of FIG. 2A, arranged between the first and second lumiphoric material regions 16-1, 16-2 and corresponding LED chips 12-1, 12-2. In this manner, a lateral spacing between the first and second lumiphoric material regions 16-1, 16-2 may be reduced. As such, the reduced lateral spacing may provide the LED package 52 with suitable dimensions for use under a small optic or lens in certain lighting fixtures or modules.

Figure 11A:
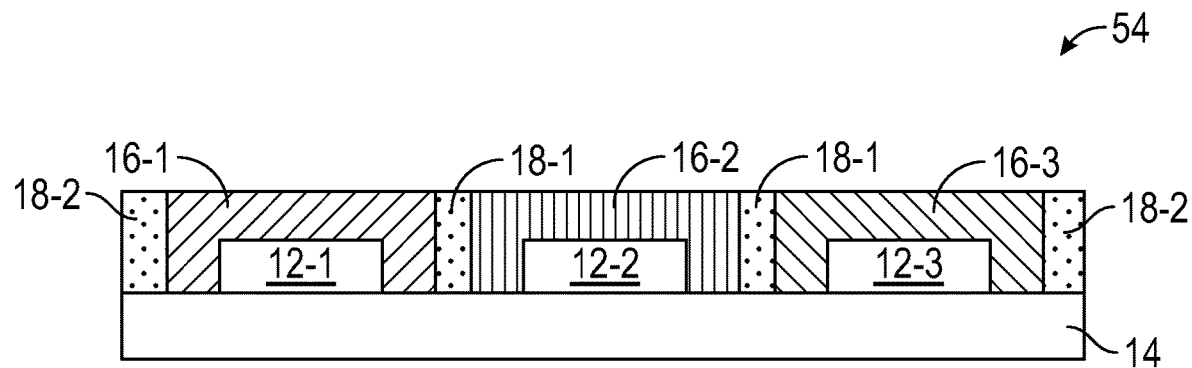
FIG. 11A is a side view of an LED package that comprises three lumiphoric material regions over corresponding LED chips according to certain embodiments.
Figure 11B:
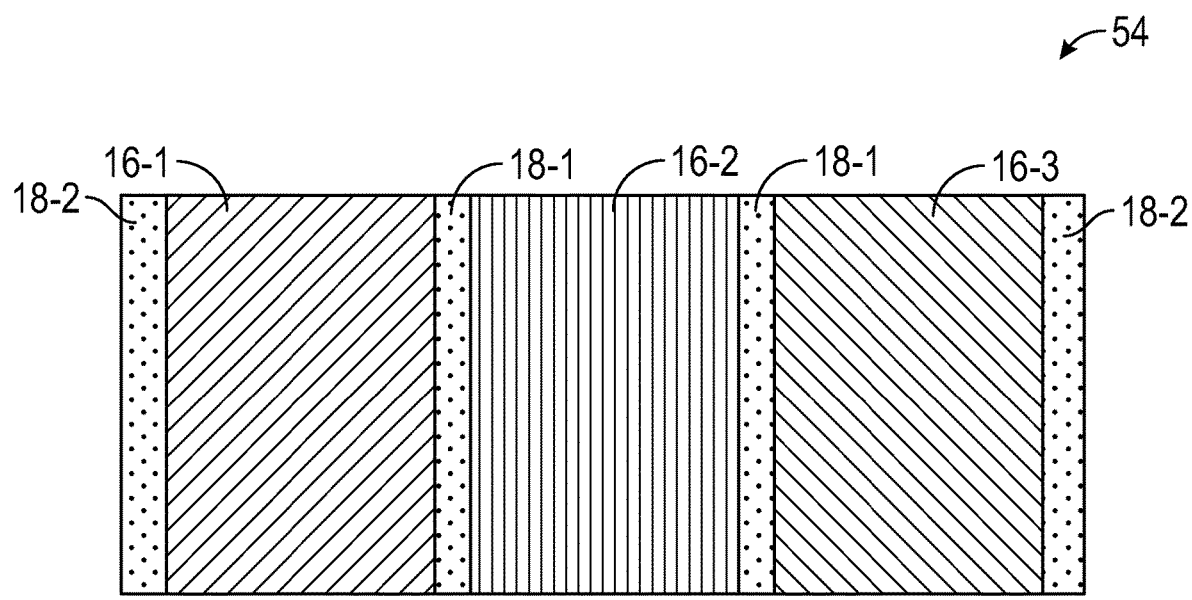
FIG. 11B is a top view of the LED package of FIG. 11A.

While the embodiments described above are illustrated with two LED chips and two corresponding lumiphoric material regions, the above-described concepts are not so limited. LED packages as described herein may include any number of additional lumiphoric material regions and corresponding LED chips. In certain embodiments, the additional lumiphoric material regions and corresponding LED chips may be configured to provide emissions having the same or different color points and/or color temperatures as other lumiphoric material regions and corresponding LED chips. By way of example, FIGS. 11A and 11B illustrate respective side and top views of an LED package 54 that comprises three lumiphoric material regions 16-1 to 16-3 over corresponding LED chips 12-1 to 12-3. As illustrated, the light-altering material segments 18-1 may form multiple interior walls while the light-altering material segments 18-2 may form perimeter walls on the submount 14. In certain embodiments, one or more of the light-altering material segments 18-1, 18-2 may be omitted or replaced with one or more dividers or submount recesses as previously described.

Figure 12:
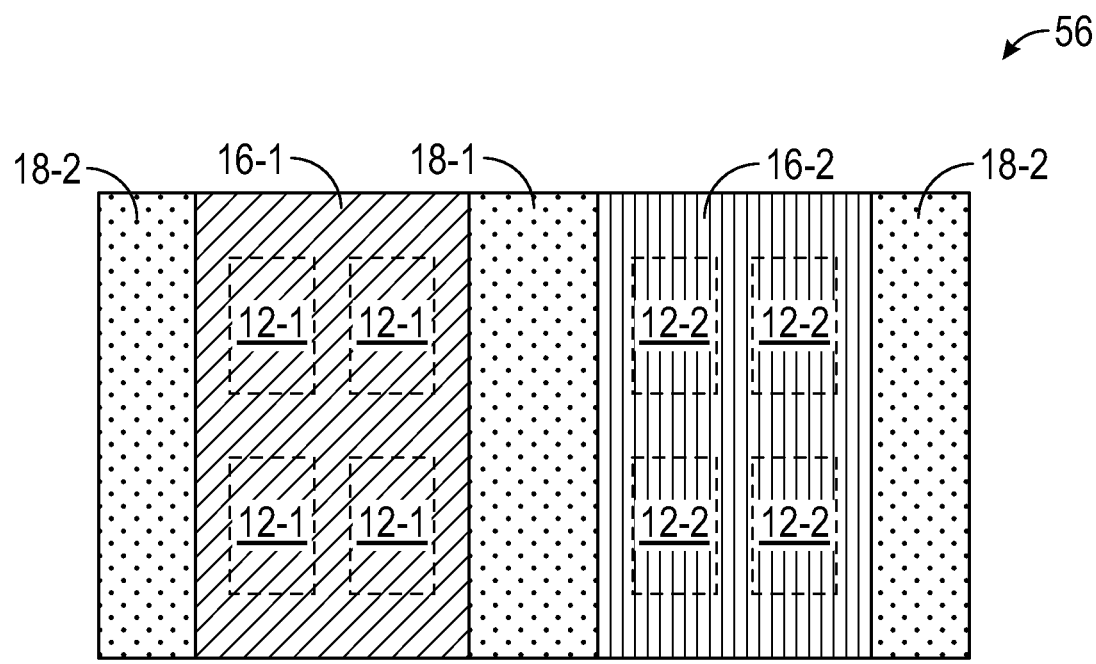
FIG. 12 is a top view of an LED package where a first lumiphoric material region is registered with a plurality of first LED chips and a second lumiphoric material region is registered with a plurality of second LED chips according to certain embodiments.

While the embodiments described above are illustrated with a single LED chip under a corresponding lumiphoric material region, the above-described concepts are not so limited. Depending on the application, LED packages as described herein may include a plurality of LED chips that are registered with a certain lumiphoric material region. In certain embodiments, an LED package may include a plurality of lumiphoric material regions, and at least one of the lumiphoric material regions is registered with a plurality of LED chips. In other embodiments, an LED package may include a single lumiphoric material region that is registered with a plurality of LED chips. By way of example, FIG. 12 is a top view of an LED package 56 where the first lumiphoric material region 16-1 is registered with a plurality of first LED chips 12-1 and the second lumiphoric material region 16-2 is registered with a plurality of second LED chips 12-2. As illustrated, the light-altering material segment 18-1 may form an interior wall and the light-altering material segments 18-2 may form one or more exterior walls. In other embodiments, the light-altering material segments 18-2 may be omitted as described for FIGS. 5A and 5B. In still other embodiments, all of the light-altering material segments 18-1, 18-2 may be omitted as described for FIGS. 10A-10C.

Figure 13:
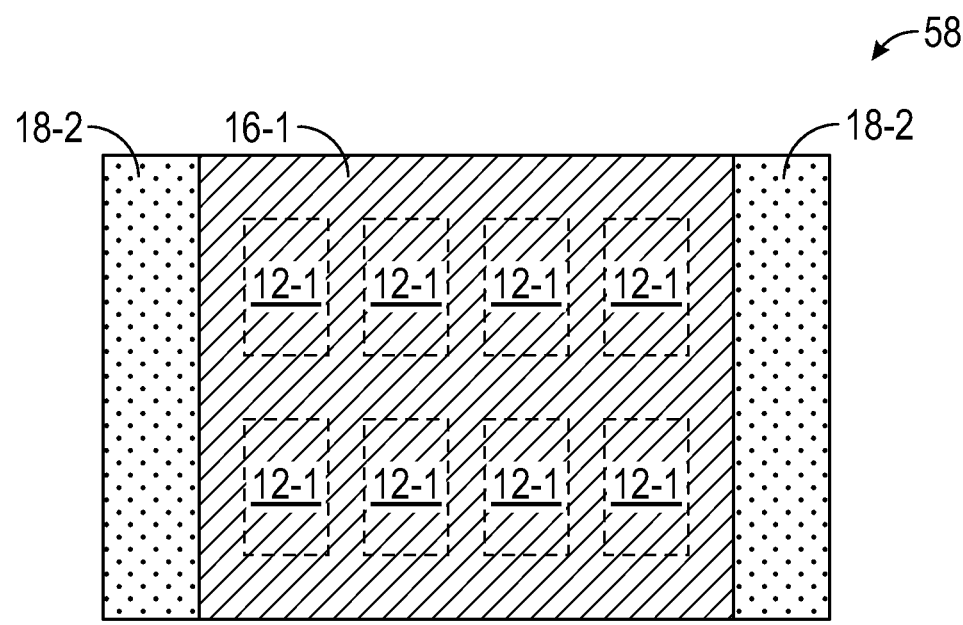
FIG. 13 is a top view of an LED package where a single lumiphoric material region is registered with a plurality of LED chips according to certain embodiments.

FIG. 13 is a top view of an LED package 58 where a single lumiphoric material region 16-1 is registered with a plurality of LED chips 12-1. In certain embodiments, the light-altering material segments 18-2 may be provided as one or more perimeter walls arranged at less than all lateral edges of the LED package 58 such that one or more peripheral edges of the lumiphoric material region 16-1 are vertically aligned with one or more peripheral edges of the submount (e.g., 14 in FIG. 2C) as previously described. In other embodiments, the light-altering material segments 18-2 may be omitted as described for FIGS. 10A-10C.

Embodiments as disclosed herein may provide one or more of the following beneficial technical effects: providing LED packages with lumiphoric material regions in close proximity to one another; providing reduced-size LED packages capable of providing different and selectable emission characteristics; providing such LED packages with increased light output; and providing such LED packages with reduced manufacturing steps and associated costs.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
a submount;
at least one first LED chip on the submount and a first lumiphoric material region that is registered with the at least one first LED chip;
at least one second LED chip on the submount and a second lumiphoric material region that is registered with the at least one second LED chip, wherein at least one peripheral edge of the first lumiphoric material region and the second lumiphoric material region is vertically aligned within twenty-five microns (μm) or less of at least one peripheral edge of the submount;
a first light-altering material segment on the submount that forms an interior wall that is arranged between the first lumiphoric material region and the second lumiphoric material region; and
a second light-altering material segment on the submount that forms at least one perimeter wall for at least one of the first lumiphoric material region and the second lumiphoric material region.

2. The LED package of claim 1, wherein the at least one peripheral edge of the first lumiphoric material region and the second lumiphoric material region is vertically aligned and coplanar with the at least one peripheral edge of the submount.

3. The LED package of claim 1, wherein a peripheral edge of the first light-altering material segment is vertically aligned within five μm or less with a same peripheral edge of the submount that is vertically aligned with the at least one peripheral edge of the first lumiphoric material region and the second lumiphoric material region.

4. The LED package of claim 3, wherein the peripheral edge of the first light-altering material segment is vertically aligned and coplanar with the same peripheral edge of the submount.

5. The LED package of claim 1, wherein the first light-altering material segment and the second light-altering material segment are nonintersecting with one another.

6. The LED package of claim 1, wherein at least one of the first light-altering material segment and the second light-altering material segment is arranged in a linear manner across the submount.

7. The LED package of claim 1, wherein at least one of the first light-altering material segment and the second light-altering material segment is arranged in a nonlinear manner across the submount.

8. The LED package of claim 1, wherein the submount forms a recess that is arranged between the first lumiphoric material region and the second lumiphoric material region.

9. The LED package of claim 1, further comprising at least one third LED chip and a third lumiphoric material region that is registered with the at least one third LED chip.

10. The LED package of claim 1, wherein the at least one first LED chip comprises a plurality of first LED chips.

11. The LED package of claim 1, wherein the at least one peripheral edge of the first lumiphoric material region and the second lumiphoric material region is vertically aligned within five μm or less of the at least one peripheral edge of the submount.

12. A light-emitting diode (LED) package comprising:
a submount;
at least one first LED chip on the submount and a first lumiphoric material region that is registered with the at least one first LED chip;
at least one second LED chip on the submount and a second lumiphoric material region that is registered with the at least one second LED chip; and
a light-altering material on the submount that is arranged to form one or more nonintersecting light-altering material segments that at least partially define one or more peripheral boundaries of the first lumiphoric material region and the second lumiphoric material region.

13. The LED package of claim 12, wherein at least one of the first lumiphoric material region and the second lumiphoric material region is vertically aligned within five microns (μm) or less of at least one peripheral edge of the submount.

14. The LED package of claim 12, wherein the one or more nonintersecting light-altering material segments form an interior wall between the first lumiphoric material region and the second lumiphoric material region.

15. The LED package of claim 12, wherein the at least one first LED chip and the at least one the second LED chip are separately controllable relative to one another.

16. The LED package of claim 12, further comprising a plurality of metal traces that provide separate anode and cathode connections for each of the at least one first LED chip and the at least one second LED chip, wherein the plurality of metal traces are arranged on a same face of the submount on which the at least one first LED chip and the at least one second LED chip are mounted.

17. The LED package of claim 16, further comprising a plurality of package contacts arranged on a back face of the submount that is opposite the face of the submount on which the at least one first LED chip and the at least one second LED chip are mounted.

18. The LED package of claim 17, further comprising a plurality of conductive vias that extend through the submount to form electrically conductive paths between the plurality of metal traces and the plurality of package contacts.

19. The LED package of claim 16, wherein the one or more nonintersecting light-altering material segments are arranged to cover only portions of the plurality of metal traces.

20. The LED package of claim 12, wherein at least one of the first lumiphoric material region and the second lumiphoric material region forms a curved top surface.

21. The LED package of claim 12, wherein at least one of the first lumiphoric material region and the second lumiphoric material region comprises lumiphoric materials that are provided with a non-uniform distribution within a binder.

22. The LED package of claim 12, wherein one or more of the at least one first LED chip and the at least one second LED chip is flip-chip mounted to the submount.

23. The LED package of claim 12, wherein at least one of the first lumiphoric material region and the second lumiphoric material region comprises at least one of dispensed lumiphoric materials, spray-coated lumiphoric materials, a pre-formed flexible sheet of lumiphoric materials, or a pre-formed rigid structure.

24. A light-emitting diode (LED) package comprising:
a submount;
at least one LED chip on the submount and a lumiphoric material region that is registered with the at least one LED chip, wherein at least one peripheral edge of the lumiphoric material region is vertically aligned within twenty-five microns ($\mu$m) or less of at least one peripheral edge of the submount; and
a light-altering material on the submount that is arranged to form one or more nonintersecting light-altering material segments that at least partially define one or more peripheral boundaries of the lumiphoric material region.

25. The LED package of claim 24, wherein the one or more nonintersecting light-altering material segments form at least one perimeter wall for the lumiphoric material region.

26. The LED package of claim 24, wherein a peripheral edge of the one or more nonintersecting light-altering material segments is vertically aligned within five $\mu$m or less of a same peripheral edge of the submount that is vertically aligned with the at least one peripheral edge of the lumiphoric material region.

27. The LED package of claim 24, wherein the at least one LED chip comprises a plurality of LED chips.

28. The LED package of claim 24, wherein the at least one peripheral edge of the lumiphoric material region is vertically aligned within five $\mu$m or less of the at least one peripheral edge of the submount.

29. A light-emitting diode (LED) package comprising:
a submount;
at least one first LED chip on the submount and a first lumiphoric material region that is registered with the at least one first LED chip;
at least one second LED chip on the submount and a second lumiphoric material region that is registered with the at least one second LED chip, wherein at least one peripheral edge of the first lumiphoric material region and the second lumiphoric material region is vertically aligned within twenty-five microns ($\mu$m) or less of at least one peripheral edge of the submount; and
a divider on the submount that is arranged between the first lumiphoric material region and the second lumiphoric material region, wherein the divider comprises a height from the submount that is less than a height of at least one of the first lumiphoric material region and the second lumiphoric material region.

30. The LED package of claim 29, wherein the divider is a continuous portion of the submount.

31. The LED package of claim 29, wherein the height of the divider is the same or less than a height of the at least one first LED chip.

32. The LED package of claim 29, wherein the divider comprises a transparent material.

* * * * *